United States Patent [19]

Yokoyama et al.

[11] Patent Number: 4,819,215

[45] Date of Patent: Apr. 4, 1989

[54] ELECTRIC SIGNAL TRANSFER ELEMENT

[75] Inventors: Takeo Yokoyama, Ebina; Hidetoshi Yamazoe, Tokyo, both of Japan

[73] Assignee: Showa Electric Wire & Cable Co., Ltd., Japan

[21] Appl. No.: 8,363

[22] Filed: Jan. 29, 1987

[30] Foreign Application Priority Data

| Jan. 31, 1986 | [JP] | Japan | 61-19722 |
| Feb. 7, 1986 | [JP] | Japan | 61-25260 |
| Apr. 17, 1986 | [JP] | Japan | 61-89020 |

[51] Int. Cl.$^4$ .............................................. H04B 1/06
[52] U.S. Cl. ..................... 367/135; 333/143; 310/334
[58] Field of Search ............... 367/134, 135, 137, 103; 333/143, 186; 310/334, 327, 323

[56] References Cited

U.S. PATENT DOCUMENTS

| 2,707,755 | 5/1955 | Hardie et al. | 310/327 |
| 3,875,550 | 4/1975 | Quate et al. | 367/103 |
| 3,894,169 | 7/1975 | Miller | 367/2 |
| 4,016,512 | 4/1977 | Wauk, II | 333/143 |
| 4,119,941 | 10/1978 | Moore et al. | 367/134 |

Primary Examiner—Thomas H. Tarcza
Assistant Examiner—Daniel T. Pihulic
Attorney, Agent, or Firm—Lorusso & Loud

[57] ABSTRACT

An electrical signal transfer element is disclosed. This element consists of a ultrasonic wave solid propagation medium, input and output transducers and backing members. The ultrasonic wave solid propagation medium has a ultrasonic wave propagation distance which is shorter than a distance between main surfaces or a distance between side surfaces. The input and output transducers attached to ultrasonic wave signal input and output surfaces of the foregoing propagation medium serve to convert an input electric signal into a ultrasonic wave and to convert this ultrasonic wave into an output electric signal. The backing members are joined to surfaces opposite to joint surfaces of the input and output transducers to the propagation medium.

7 Claims, 7 Drawing Sheets

ELECTRIC SIGNAL TRANSFER ELEMENT

BACKGROUND OF THE INVENTION

1. Field of the Invention

The present invention relates to an electric signal transfer element which utilises ultrasonic waves, and more particularly, to an electric signal transfer element wherein spuriouses of odd multiplication reflected waves of transfer electric signals are attenuated.

2. Related Art Statement

Where electric insulation between circuits or between appliances is effected while transferring electric signals, it has heretofore been well known that a photo coupler is employed as an isolator.

Figure 5:
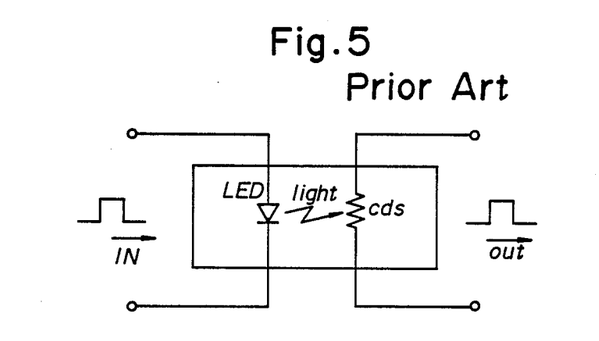
FIG. 5 is an explanatory view showing a conventional electric signal transfer element.

This photo coupler which is molded into a single package is, as illustrated in FIG. 5, composed by a light emission element LED (Light Emission Diode) and a light receiving element CdS (or a photo transistor). The thus constructed photo coupler performs the insulation both on the input-side and on the output-side, in which case the light serves as a medium.

For this reason, there are yielded advantages wherein it is feasible to freely arrange a power source voltage (including a bias) between the appliances and to select an earthing point for the two systems. Moreover, noises can be reduced.

This type of photo coupler is, however, attended with the following disadvantages. This photo coupler is slow of frequency responding velocity, and a transferable pulse repeating frequency of an inexpensive general purpose photo coupler is for now 1 MHz or less. Other types of photo couplers the frequency of which is 10 mHz or thereabouts are put on the market, but they are so expensive that they are not yet utilised in broadly used appliances.

The photo coupler transfers the signals in only one direction. For instance, when this photo coupler is employed for an interface of a microcomputer, totally two pieces of photo couplers are needed for transmitting-/receiving signal wires, this undesirably conducing to an increase in cost.

SUMMARY OF THE INVENTION

The above-described drawbacks in the prior art apparatus have been successfully eliminated by the present invention.

It is a primary object of the present invention which has been inspired by the above-described circumstances to provide an electric signal transfer element wherein a frequency responding velocity is high, bidirectional transfer can be possible, it can readily be manufactured, the necessary costs can be decreased, and spuriouses of odd multiplication reflected waves of transfer electric signals are attenuated.

To this end, according to one aspect of the invention, there is provided an electric signal transfer element which comprises: a ultrasonic wave solid propagation medium having a ultrasonic propagation distance is shorter than a distance between individual main surfaces or a distance between individual side surfaces; input and output transducers, attached to input and output surfaces of the ultrasonic wave solid propagation medium, for converting an input electric signal into a ultrasonic wave and for converting the thus obtained ultrasonic wave into an output electric signal; and backing members joined to surfaces opposite to joint surfaces of the input and output transducers to the foregoing propagation medium.

These and other objects of the invention will become apparent from the following description of embodiments thereof when taken together with the drawings.

DETAILED DESCRIPTION OF THE PREFERRED EMBODIMENTS:

A first preferred embodiment of the present invention will hereinafter be described with reference to FIGS. 1 to 3.

Figures 1, 2, 3:
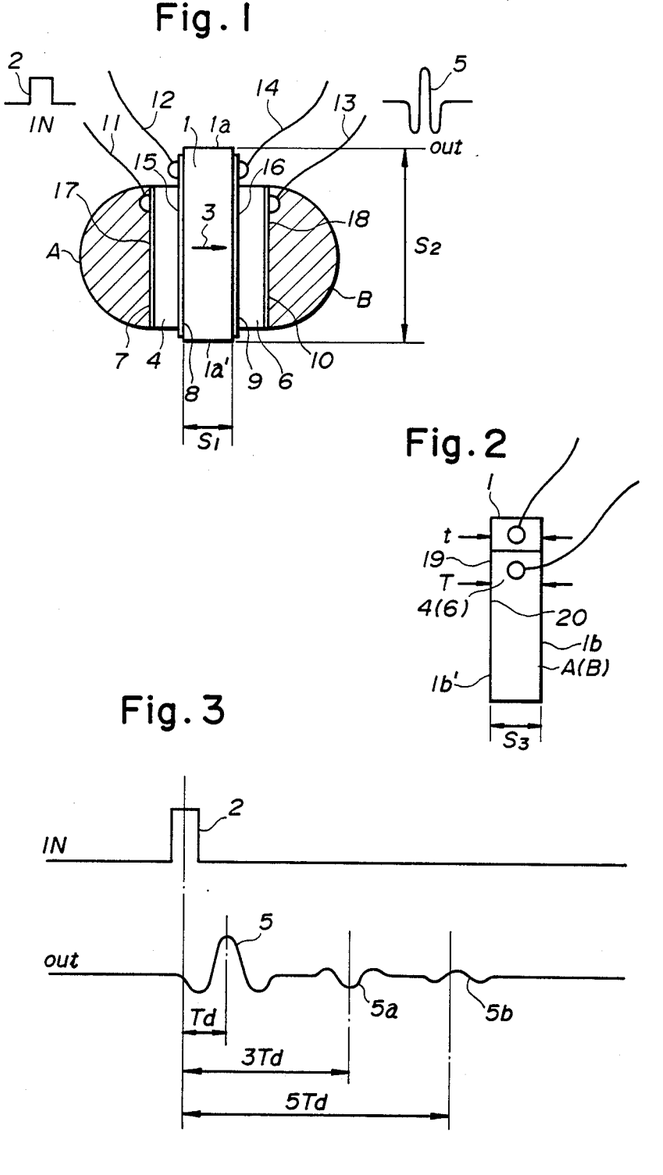
FIG. 1 is an elevational view of an electric signal transfer element, showing a first embodiment of the present invention.
FIG. 2 is a side view of the electric signal transfer element according to the present invention.
FIG. 3 is an explanatory view showing operations of the electric signal transfer element according to the present invention.

An electric signal transfer element according to the present invention is, as illustrated in FIG. 1, constructed such that a ultrasonic wave solid propagation medium 1 is equipped with an input transducer 4 for converting an input electric pulse 2 defined as an input electric signal into an ultrasonic wave 3 and with an output transducer 6 for converting the ultrasonic wave 3 defined as an output electric signal into an output electric pulse 5.

This ultrasonic wave solid propagation medium 1 serves to propagate the ultrasonic wave and to separate electric coupling of the input and output transducers 4, 6 from each other.

Generally speaking, it is desirable that this solid propagation medium 1 is formed of materials which have impedance approximate to acoustic impedance of the transducers. More desirably, the medium 1 is made of the material identical with that of which the transducers are shaped.

The input and output transducers 4, 6 which employ piezo-electric materials effect conversion with respect to the electric pulses 2, 5 and the ultrasonic wave 3.

It is to be noted that the reference numerals 7, 8, 9, 10 are electrodes of the input and output transducers 4, 6; and the numerals 11 to 14 denote lead wires.

On surfaces 17, 18 opposite to joint surfaces 15, 16 of the input and output transducers 4, 6 to the above-described propagation medium 1, there are respectively provided backing members A, B which attenuate spuriouses of odd multiplication stroke reflected waves generated just when being reflected on the transducers.

The backing member formed of epoxy resin is capable of absorbing the ultrasonic wave. The material may be identical with that of the ultrasonic solid propagation medium 1 and may include a scattering surface formed thereon by etching or a corrosion method, this scattering surface causing irregular reflection of the ultrasonic wave.

Each of the input and output transducers 4, 6 has a thickness T equivalent to a thickness t (see FIG. 2) of the ultrasonic wave solid propagation medium 1, and these transducers 4, 6 are orthogonal to boudary surfaces 19, 20 of the ultrasonic wave solid propagation medium 1.

A distance, i.e., a ultrasonic wave propagation distance $S_1$, between the joint surfaces 15, 16 is arranged to be shorter than a distance $S_2$ between side surface 1a, 1a' of the propagation medium 1. The symbols 1b, 1b' stand for main surfaces of the propagation medium 1, and $S_3$ represents a distance between the main surfaces (see FIGS. 2, 4). The ultrasonic wave propagation distance $S_1$ is shorter than the distance $S_3$ between the main surfaces or the distance $S_2$ between the side surfaces.

According to the thus constructed electric signal transfer element, the input electric pulse 2 is converted into the ultrasonic wave 3 by means of the input transducer 4, thereby advancing the ultrasonic wave solid propagation medium 1. The ultrasonic wave 3 is further converted into the output electric pulse 5 by the output transducer 6. Namely, after a 1-fold stroke time Td has passed, the output electric pulse 5 is obtained as a direct propagation signal. FIG. 3 shows responses of the input and output. The direct propagation signal is reflected on the side of output because of mismatching between the acoustic impedance of the output transducer 6 and the acoustic impedance of the ultrasonic wave solid propagation medium 1 and of another mismatching between an electrically equivalent impedance of the output transducer 6 and an externally attached impedance. The direct propagation signal is further reflected on the side of input, whereby a reflected wave spurious 5a having a 3-fold stroke time 3Td for which the direct propagation signal reaches a given point on the output-side. Sequentially, odd multiplication reflected wave spuriouses such as a reflected wave spurious 5b having a 5-fold stroke time 5Td are generated.

The backing members A, B are provided on the surfaces 17, 18 opposite to the joint surfaces 15, 16 of the input and output transducers 4, 6 to the propagation medium 1. In such a constitution, the spuriouses of such reflected waves are attenuated by causing the backing members formed of the expoxy resin to absorb the ultrasonic waves because of the fact that the spurious of the reflected wave is small as compared with the direct propagation signal, or by causing irregular reflection of the ultrasonic waves on the scattering surfaces of the backing members formed of the material identical with that of the ultrasonic wave solid propagation medium 1.

As explained earlier, the input transducer 4 and the output transducer 6 have the thickness T equivalent to the thickness t (see FIG. 2) of the ultrasonic wave solid propagation medium 1 and are at the same time orthogonal to the boundary surfaces 19, 20 of the propagation medium 1. The input and output transducers 4, 6 are virtually possessed of a function to effect transmission or non-transmission of mode waves except a zero mode wave, which facilitates a construction of a non-dispersive mode electric signal transfer element. A rectilinear propagation wave emitted from the input transducer 4 travels straight between the boundary surfaces 19, 20 of the ultrasonic wave solid propagation medium 1 and falls on the output transfer 6.

The thus obtained electric signal transfer element is capable of separating the electric coupling by insulating the input from the output through the intermediary of the ultrasonic wave, i.e., the solid propagation medium on the occasion when insulating circuits or appliances from each other as an isolator while transferring the electric signals. For this reason, it is favourably possible to freely arrange a power source voltage (including a bias) between appliances and to freely select an earthing point for the two systems. Moreover, noises can be reduced.

A transferable pulse repeating frequency of the electric signal transfer element according to the present invention depends on frequency responses of the input and output transducers. For example, if piezo-electric single crystal be used, the pulse transferable value ranges to frequencies of 100 MHz or thereabouts. This is 100 times as high as that of general purpose photo couplers which are now available in the market.

The photo coupler transfers the signals in only one direction. In the case of its being used for an interface of a microcomputer, totally two pieces photo couplers are required for transmitting/receiving signal wires. The electric signal transfer element according to the present invention can transfer the signals bidirectionally. In addition, the single electric signal transfer element suffices, this advantageously leading to a decrease in cost of production.

Figure 4:
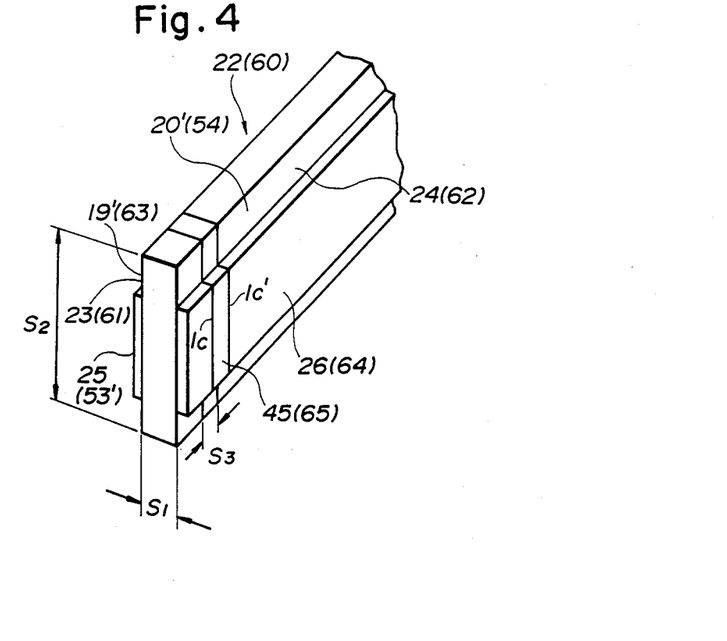
FIG. 4 is an explanatory view showing a situation where the electric signal transfer element according to the present invention is constructed.

When constructing this kind of electric signal transfer element, as shown in FIG. 4, a block 22 of the ultrasonic wave solid propagation medium 1 is prepared. The block 22 which is previously so designed as to become a rectangular parallelepiped with given dimensions assumes, as a matter of course, a hexahedral configuration including the boundary surfaces 19, 20. Tin electrodes 23, 24 are vapour-deposited on boundary surfaces 19', 20', and an input transducer strip 25 and an output transducer strip 26 are disposed thereon. Backing members A, B (see FIG. 1) are formed in such a manner that the epoxy resin is, for instance, bonded to surfaces 17, 18 opposite to joint surfaces 15, 16 of the input and output transducer strips 25, 26 to the propagation medium 1. The resultant object is cut by a slicing machine, thereby obtaining units 45 each having the input transducer 4 and the output transducer 6.

In this manufacturing technique, the block of the ultrasonic wave solid propagation medium is formed with surfaces of a polygon having a previously designed configuration and given dimensions; and the backing members are bonded to the block in a state wherein the input and output transducer strips are provided. Thereafter, the whole object is cut into a plurality of units. Consequently, the thus obtained units do not assume irregularity in shape, and the electric signal transfer element with high quality can be mass-produced at low costs.

Inasmuch as the input and output transducers are cut to the same thickness as that of the ultrasonic wave solid propagation medium, it is feasible to facilitate the construction of the non-dispersive mode electric signal transfer element.

A preferred second embodiment of the present invention will be described with reference to FIGS. 6 to 8 as follows.

Figures 6A, 6B:
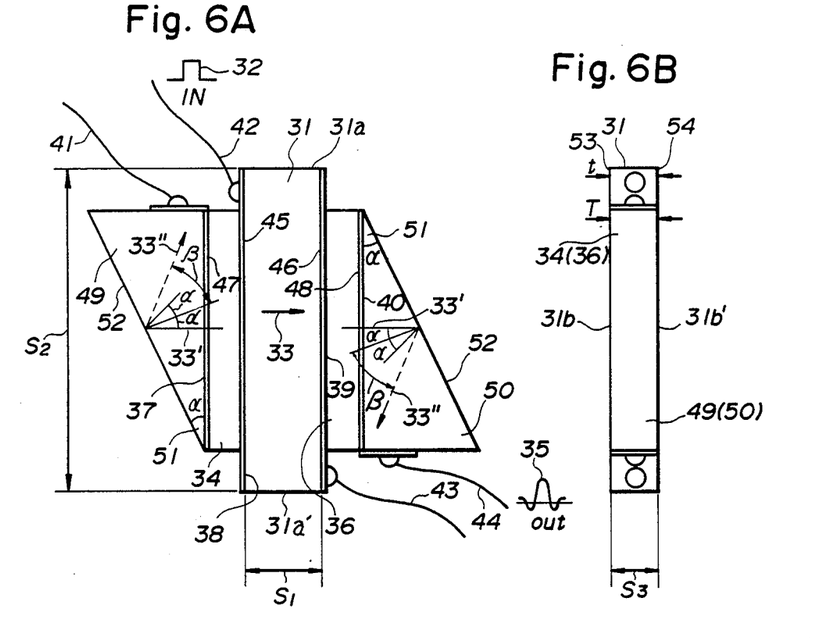
FIGS. 6A, 6B are elevational and side views, each showing a second embodiment of the present invention.
Figure 7A:
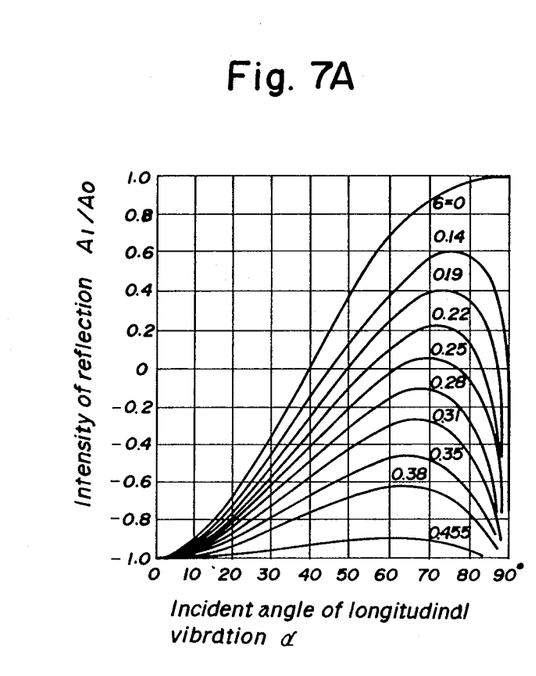
FIGS. 7A, 7B are explanatory views, each showing operations relative to a second embodiment of the present invention.
Figure 7B:
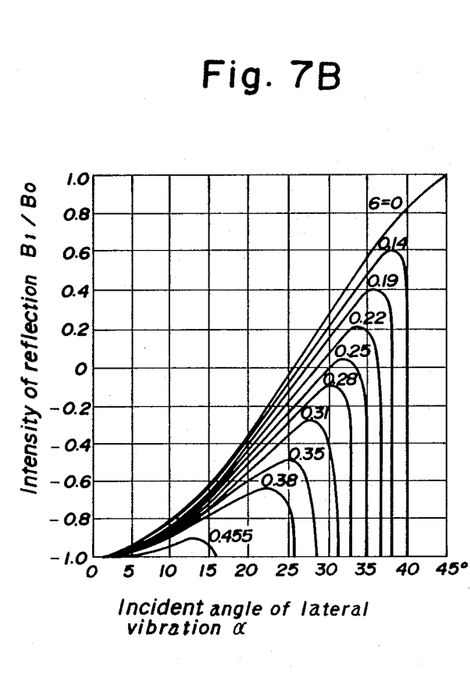

Referring to FIG. 6, there are shown a ultrasonic wave solid propagation medium 31, an input transducer 34, an output transducer 36, a distance $S_1$ between joint surfaces 45, 46, a distance $S_2$ between side surfaces 31a, 31a', a distance $S_3$ between main surfaces 31b, 31b', electrodes 37, 38, 39, 40 employed for the transducers 34, 36 and lead wires 41, 44 which are connected the foregoing electrodes. These components or values are structurally or virtually the same as those of the first embodiment shown in FIG. 1 and hence the description is herein omitted.

Backing members 49, 50 each assuming a configuration illustrated in FIG. 6 are respectively bonded to surfaces 47, 48 opposite to the joint surfaces 45, 46 of the input and output transducers 34, 36 to the propagation medium 31. Each of the backing members 49, 50 includes a reflective surface 52 having a mode conversion angle 51 at which a ultrasonic wave 33' of any one of a longitudinal wave and a transversal wave which fall from the transducers joined to the backing members on these backing members is converted into a ultrasonic wave 33" of the other wave.

The backing members are formed of the epoxy resin suitable for absorbing the ultrasonic wave or of the material identical with that of the ultrasonic wave solid propagation medium 31. Each of the backing members may subsume a scattering surface formed on its surface exclusive of the reflection surface 52 by etching or by a corrosion method, whereby the ultrasonic wave undergoes irregular reflection. It is particularly desirable that the backing members are made of a material which has an impedance approximate to the acoustic impedance of the transducer. The material involves, for instance, glass which favourably contributes to less reflection on the boundary surfaces of the transducers.

Each of the input and output transducers 34, 36 has the thickness T equivalent to the thickness t (see FIG. 6 B) of the ultrasonic solid propagation medium 31. These transducers 34, 36 are orthogonal to the boundary surfaces 53, 54 of the solid propagation medium 31.

According to the thus constructed electric signal transfer element, an input electric pulse 32 is converted into a ultrasonic wave 33 by means of the input transducer 34 and the solid propagation medium 31 is thereby advanced. The ultrasonic wave 33 is converted into an output electric pulse 35 by means of the output transducer 36. That is, after a 1-fold stroke time has passed, the output electric pulse 35 is obtained as the direct propagation signal.

Generally, the direct propagation signal is reflected on the output-side on account of mismatching between the acoustic impedance of the output transducer 36 and the acoustic impedance of the ultrasonic wave solid propagation medium 31 and of mismatching between the electrically equivalent impedance of the output transducer 36 and the externally attached impedance. The direct propagation signal is further reflected on the input-side, and a reflected wave spurious 5a having a 3-fold stroke time 3Td for which the direct propagation signal reaches a given point on the output-side is generated. Sequentially, odd multiplication reflected wave spuriouses such as a reflected wave spurious 5a having a 5-fold stroke time 5Td are present (see FIG. 3).

The above-described first embodiment adopts a constitution wherein the reflected wave spuriouses are attenuated and are then removed by the backing members. As a result of a further pursuit of the removal of reflected wave spuriouses, the present inventors have devised means for eliminating the reflective spuriouses more surely than that of the first embodiment.

Videlicet, the electric signal transfer element relative to the second embodiment of the present invention is arranged such that on the surfaces 47, 48 opposite to the joint surfaces 45, 46 of the input and output transducers 34, 36 to the propagation medium 31 are bonded to the backing members each including a reflection surface 52 which has a mode conversion angle 51 at which a ultrasonic wave 33' of any one of the longitudinal wave and the transversal wave that fall from the transducers attached to the backing members on these backing members is converted into a ultrasonic wave 33" of the other wave. The electric signal transfer element is thus designed in order to remove the odd-numbered reflected wave spuriouses.

Figure 8A:
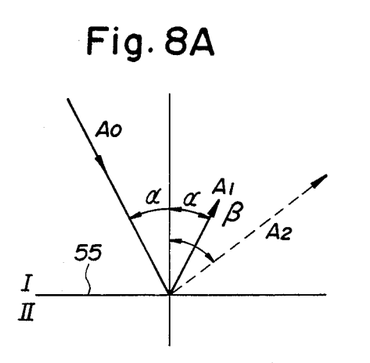
FIGS. 8A, 8B are explanatory views, each showing the second embodiment of the present invention.

To be more specific, when a longitudinal wave A, as illustrated in FIG. 8A, falls at an angle $\alpha$ on the boundary surface 55 between a solid medium I and a fluid medium II, the reflected wave is present in a transversal wave $A_2$ as well as in a lonitudinal wave $A_1$. A reflection angle of the longitudinal wave is equal to the incident angle $\alpha$. A reflection angle $\alpha$ of the transversal wave, however, differs from this incident angle. An interrelation between theses reflection angles of the longitudinal and transversal waves is expressed such as:

$$\sin \alpha / \sin \beta = Cp1/Cs1$$

where Cp1 is the propagation velocity of the longitudinal wave in the medium I, and Cs1 is the propagation velocity of the transversal wave in the medium I.

An intensity, given by $A_1/A_0$, of an incidence longitudinal wave $A_0$ and the reflection longitudinal wave $A_1$ is conditional on the incident angle $\alpha$ when a Poisson's ratio $\alpha$ (see FIG. 7A) of the medium I is defined as a parameter, and there exits an incident angle at which the intensity of the reflection longitudinal wave $A_1$ becomes zero. The incidence longitudinal wave $A_0$ is completely converted into the transversal wave $A_2$ when obtaining the angle at which the amplitude of this reflection longitudinal wave $A_1$ becomes zero. For example, where the medium I is lead glass having a Poisson's ratio of approximately 0.22 and the fluid medium II is the air, the incident angle $\alpha$ comes to some 55°, and the intensity of the reflection longitudinal wave $A_1$. As a result, the incidence longitudinal wave $A_0$ is subjected to complete conversion into the trasversal wave $A_2$.

Figure 8B:
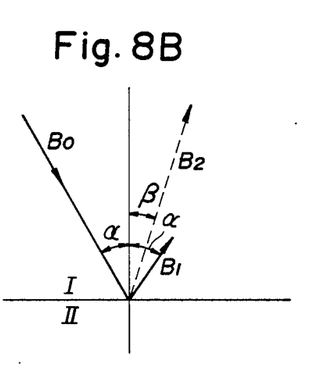

When the incident wave involves a transversal wave, a relation between an incidence transversal wave $B_0$, a reflection transversal wave $B_1$ and a longitudinal wave $B_2$ is shown in FIG. 8 B. An intensity given by $B_1/B_0$ depends on the incident angle $\alpha$ when the Poisson'ratio $\alpha$ (see FIG. 7B) of the medium I serves as the parameter. There also exists an incident angle at which the intensity of the reflection transversal wave $B_1$ becomes zero. Provided that the medium I is the lead glass with a Poisson's ratio of about 0.22 and the fluid medium II is the air, the intensity of the reflection transversal wave $B_1$ comes to zero at an incident angle of about 28°. In consequence, the incidence transversal wave $B_0$ is completely converted into the longitudinal wave $B_2$. In the case of this transversal wave, as is obvious from FIG.

7B, there is a critical angle (approximately 37° when the Poisson's ratio is 0.22). When exceeding the critical angle, no mode conversion into the longitudinal wave is effected and the incident angle must therefore be the critical angle or less.

Due to the backing members 49, 50 wherein the transversal wave is converted into the longitudinal wave and vice versa, the input electric pulse 32 is converted into the ultrasonic wave 33 of the longitudinal wave by means of the input transducer 34 designed for the longitudinal wave, whereby the solid propagation medium 31 is advanced. Then the ultrasonic wave 33 is transformed into the output electric pulse 35 by the output transducer 36. This ultrasonic wave travels in the backing member 50, and its longitudinal wave 33′ is converted into the transversal wave on the reflective surface 52 inclined at the mode conversion angle 51, i.e., the incident angle α. The resultant transversal wave 33″ is immediately reflected thereon but is not transformed into the electric pulse by the output transfer 36 designed for the longitudinal wave.

Where the acoustic wave emitted from the input transducer 34 is defined as a transversal wave, the transversal wave 33′ is converted into the longitudinal wave on the reflective surface 52 having the mode conversion angle, viz., the incident angle α; and the thus converted longitudinal wave is reflected thereon. However, the longitudinal wave is by no means charged into the electric pulse by the output transducer 36 designed for the transversal wave.

As explained earlier, the electric signal transfer element according to the present invention is capable of bidirectionally transferring the electric signal. Even when the input transducer 34 serves as an output transducer and the output transducer 36 serves as in input transducer, the functions thereof are the same. The description is therefore omitted.

In this way, only the output electric pulse 35 defined as a direct propagation signal is applied to the output transducer 36 and hence no odd multiplication reflected wave spuriouses are present.

Each of the input and output transducers 34, 36, as described above, has the thickness T equivalent to the thickness t (see FIG. 6 B) of the ultrasonic wave solid propagation medium 31, and these transducers 34, 36 are orthogonal to the boundary surface 53, 54 of the ultrasonic wave solid propagation medium 31. Moreover, the input and output transducers 34, 36 virtually have a function to effect the transmission or non-transmission of the mode waves except the zero mode wave. Hence, it is possible to facilitate the construction of the non-dispersive mode electric signal transfer element. The rectilinear propagation wave emitted from the input transducer 34 travels straight between the boundary surfaces 53, 54 of the ultrasonic wave solid propagation medium 31 and then falls on the output transducer 36.

The thus obtained electric signal transfer element is capable of insulating the input from the output, in which case the ultrasonic wave serves as a medium, i.e., through the solid popagation medium, when effecting electrical insulation between circuits or appliances as an isolator while transferring the electric signals. Consequently, it is favourably feasible to freely arrange the power source voltage (including a bias) and to freely select the earthing point for the two systems. In addition, noises can be reduced.

When constructing this kind of electric signal transfer element, as shown in FIG. 4, a block 60 of the ultrasonic wave solid propagation medium 31 is prepared. This block 60 which is previously so designed as to become a rectangular parallelepiped with given dimensions assumes, as a matter of course, a hexahedral configuration including boundary surfaces 53′, 54′. Tin electrode 61, 62 are vapour-deposited on the boundary surfaces 53′, 54′, and an input transducer strip 63 and an output transducer strip 64 are disposed thereon. Backing members (see FIG. 6) which involve, for instance, glass as a material are provided on surfaces 47, 48 opposite to the joint surfaces 45, 46 of the input and output transducer strips 63, 64 to the propagation medium 31. The thus formed object is cut by a slicing machine so as to obtained units 65 each of which is equipped with the input and output transducers 34, 36.

In this manufacturing technique, the block of the ultrasonic wave solid propagation medium is formed with surfaces of a polygon having a previously designed configuration and given dimensions; and the backing members are bonded to the block in such a state that the input and output transducer strips are provided. Thereafter, the whole object is cut into a plurality of units. Consequently, the thus procured units do not assume irregularity in shape, and the electric signal transfer element with high quality can be mass-produced at low costs.

In the above-described embodiments, an example where the pulse is transferred as an electric signal has been mentioned. The electric signal transfer element according to the present invention is likewise capable of transferring an analog signal.

The electric signal transfer elements shown in the respective embodiments can be utilised as delay lines. Furthermore, if the foregoing individual electric signal transfer elements be used as pulse transfer elements, a constitution of a transfer signal reproducing circuit which is to be provided on the side of a pulse output will be simplified.

As can be clarified from the description so far made, the present invention yields the following effects. There is provided the inexpensive electric signal transfer element wherein the frequency responding velocity is high, the bidirectional transfer can be performed, the unnecessary reflected waves can be decreased or eliminated and the production does not require much labour.

If the electric signal transfer element is employed as a coupler, it is possible to obtain an output signal which shows one-to-one correspondence with respect to rising and falling of input signal by insulating the input and the output of the signal in such a manner that a direct current behaves.

A circuit for obtaining a differential wave output by applying an input electric pulse to the electric signal transfer element according to the present invention will be explained with reference to FIG. 9.

Figure 9:
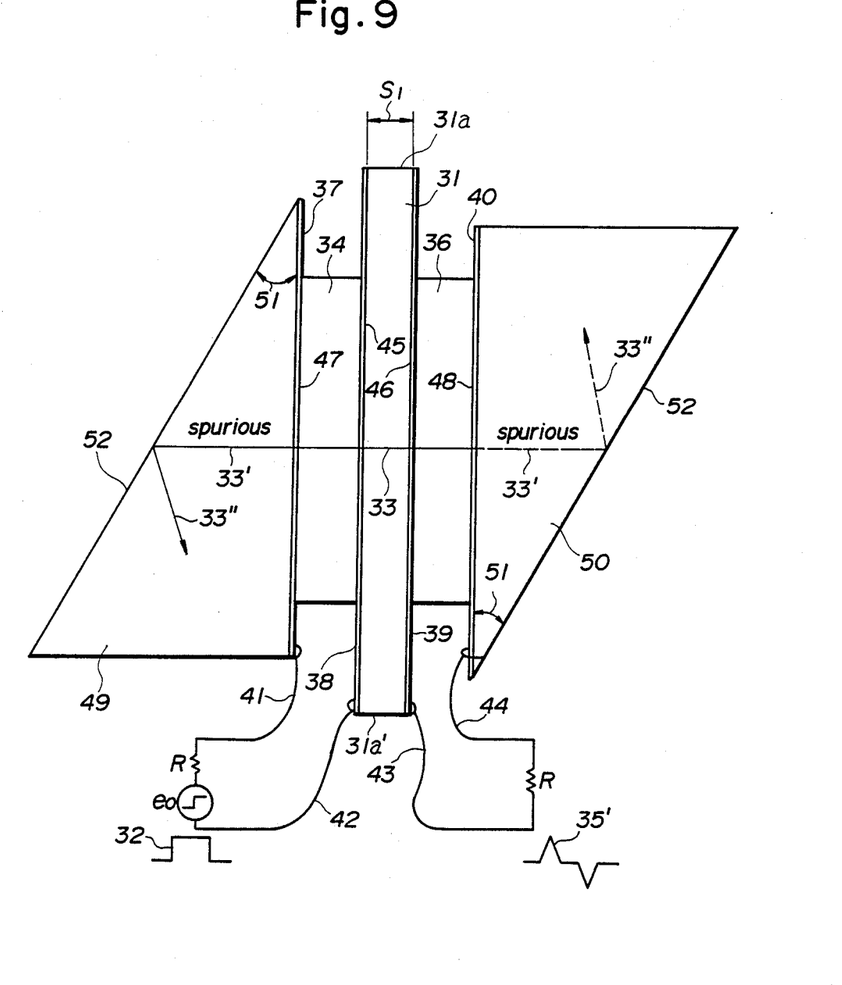
FIG. 9 is an explantory view showing the electric signal transfer element according to the present invention.

Referring now to FIG. 9, there are shown the ultrasonic wave solid propagation medium 31, the input transducer 34, the output transducer 36, the distance $S_1$ between the joint surfaces 45, 46, the distance $S_2$ between the side surfaces 31a, 31a′, the distance $S_3$ between the main surfaces 31b, 31b′, the electrodes 37, 38, 39 40 employed for the transducers 34, 36, the lead wires 41 to 44 which are connected to these electrodes and the backing members 49, 50. These components or values are structurally or virtually the same as those of the second embodiment described in FIG. 6, and hence the description is herein omitted.

A step input signal is applied through the electrodes 37, 38 to the input transducer 34. An externally attached impedance consisting of a resistance R is connected to the output transducer 35. A differential wave output 35' which exhibits one-to-one correspondence with respect to rising and falling of the step input signal 32 is obtained.

Figure 10:
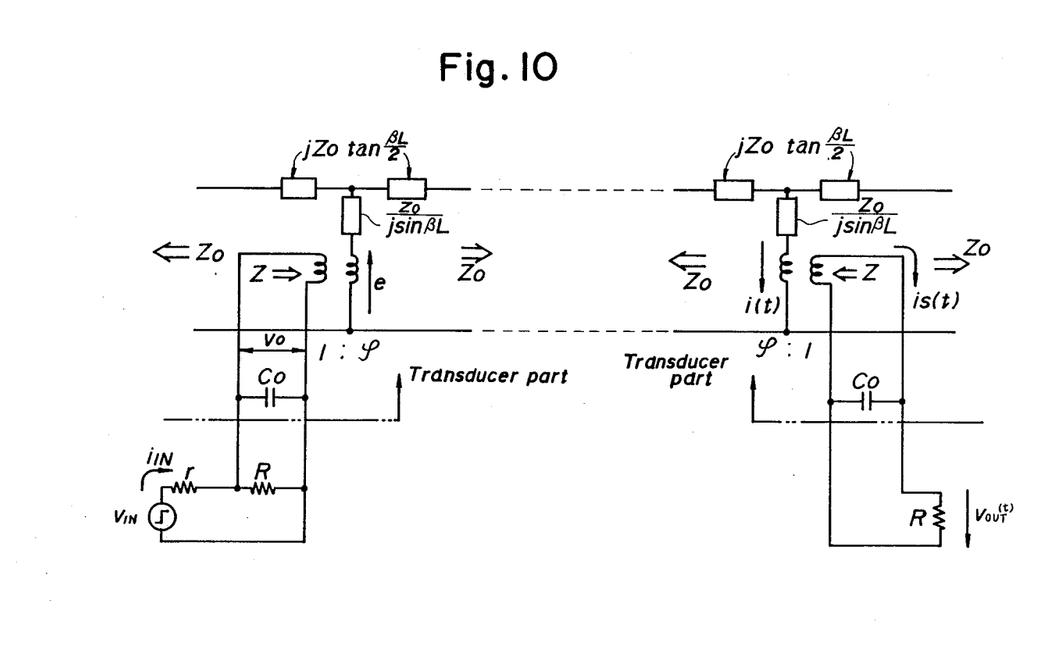
FIG. 10 is an equivalent circuit diagram of the electric signal transfer element.
Figure 11:
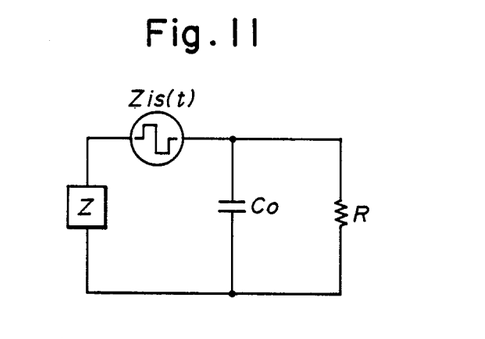
FIG. 11 is a diagram showing an electric system of the output transducer in the equivalent circuit diagram shown in FIG. 10.

FIG. 10 shows an electric system when a signal source $e_o$ and the externally attached impedance consisting of the resistance R are connected to the input and output transducers 34, 36. FIG. 11 is an equivalent circuit diagram of the electric system of the output transducer 36 deposited in FIG. 10. FIG. 11 may be redrawn into FIG. 12.

Figure 12:
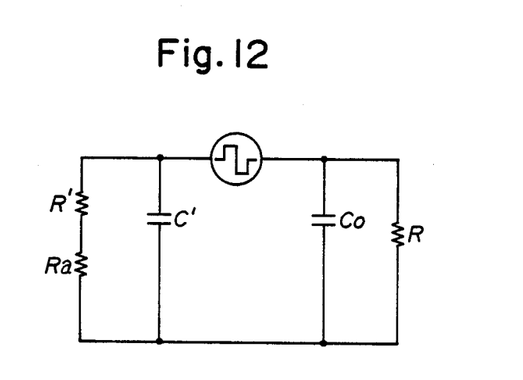
FIG. 12 is a circuit diagram into which the circuit of FIG. 11 is redrawn in another form.

The present inventors have made a study of such a possibility that the electric signal transfer element is used as an interface element between the respective devices especially of a digital circuit. They have finally come to a conclusion that the most desirable output waveform is the differential wave 35' having a peak which shows the one-to-one correspondence with respect rising and falling of the step input signal 32. In order to obtain the differential wave 35' which exhibits the one-to-one correspondence with respect to the step input signal 32, the inventors have examined a circuit constitution. As a result, they have proved that a favourable outcome can be procured in the following manner. When connecting the externally attached impedance R to the output transducer 36, a time constant RCo of a closed circuit which is composed by the externally attached impedance R and a bounded capacitance Co of the output transducer 36 is expressed such as:

$$To \leq Rco$$

where 2To is the resonant period of the output transducer.

More specifically, when a frequency f=8 MHz in this embodiment, Co=200PF and R=2 Ω. Subsequently, the ultrasonic wave propagation distance $S_1$ ranges from 0.3 mm to 0.7 mm.

The backing members 49, 50, the transducers 34, 36 and the propagation medium 31 are formed of piezoelectric crystal materials such as, for instance, PZT (titanic aid zirconic acid lead) ceramic and lithium niobate (LiMo₃) which have substantially equal impedance.

A case where the pulse is transferred as an electric signal is explained. Similarly, it is feasible to transfer an analog signal.

According to the present invention, where the externally attached impedance consisting of the resistance R is connected to the output transducer of the electric signal transfer element, the time constant RCo of the closed circuit which is composed by the externally attached impedance and the bounded capacitance Co of the output transducer is expressed such as:

$$To \leq RCo$$

where 2To is the resonant period of the output transducer. When the step input or the pulse is applied to the input transducer, a differential response in which a ringing is attenuated from the output transducer with the result that no distortion in waveform is created is obtained.

Thus, there is provided in accordance with the invention an electric signal transfer element employing ultrasonic waves which has the advantage discussed above. The embodiments described are intended to be merely exemplary and those skilled in the art will be able to make variations and modifications in them without departing from the spirit and scope of the invention. All such modifications and variations are contemplated as falling within the scope of the claims.

What is claimed is:

1. An electric signal transfer element comprising:
    an ultrasonic wave solid propagation medium having ultrasonic wave signal input and output surfaces with an ultrasonic wave propagation distance therebetween which is shorter than a distance between opposed main surfaces of said medium or a distance between opposed side surfaces of said medium;
    input and output transducers, attached to said ultrasonic wave signal input and output surfaces of said ultrasonic wave solid propagation medium, for converting an input electric signal into an ultrasonic wave and for converting the ultrasonic wave into an output electric signal; and
    a pair of backing members joined to surfaces of said input and output transducers opposite to said ultrasonic wave signal input and output surfaces of said ultrasonic wave solid propagation medium;
    each of said backing members including a reflective surface having a mode conversion angle at which an ultrasonic wave which falls from said input and output transducers on said reflective surfaces of said backing members is mode-converted from a longitudinal wave to a transversal wave or from a transversal wave to a longitudinal wave so that each of said backing members is adapted to eliminate said mode-converted wave from being reflected on said input and output transducers.

2. An electric signal transfer element as set forth in claim 1, wherein said reflective surface of each of said backing members is oriented at an angle of such incidence relative to the direction of propagation such that for an incidence ultrasonic wave consisting of a longitudinal wave the intensity of a reflection longitudinal wave is zero and the incident longitudinal wave is converted into a transversal wave.

3. An electric signal transfer element as set forth in claim 2, wherein said input and output transducers are designed to transmit longitudinal waves.

4. An electric signal transfer element as set forth in claim 1, wherein said reflective surface of each of said backing members is oriented at an angle of incidence relative to the direction of propagation such that for an incident ultrasonic wave consisting of a transversal wave the intensity of a reflection transversal wave is zero and the incident transversal wave is converted into a longitudinal wave.

5. An electric signal transfer element as set forth in claim 4, wherein said input and output transducers are designed to transmit transversal waves.

6. An electric signal transfer element, comprising:
    an ultrasonic wave solid propagation medium having ultrasonic wave signal input and output surfaces with an ultrasonic wave propagation distance therebetween which is shorter than a distance between opposed main surfaces of said medium or a distance between opposed side surfaces of said medium;

input and output transducers, attached to said ultrasonic wave signal input and output surfaces of said ultrasonic wave solid propagation medium, for converting an input electric signal into an ultrasonic wave and for converting the ultrasonic wave into an output electric signal;

backing members joined to surfaces of said input and output transducers opposite to said ultrasonic wave signal input and output surfaces of said ultrasonic wave solid propagation medium for attenuating unnecessary signals when being reflected on said input and output transducers; and wherein an externally attached impedance consisting of at least a resistance (R) connected to said output transducer, and a time constant RCo of a closed circuit which is constituted by said externally attached impedance and a bounded capacitance (Co) of said output transducers is expressed such as To=RCo, where 2To is the resonant period of said output transducer.

7. An electric signal transfer element as set forth in claim 6, wherein backing members, transducers and a ultrasonic wave solid propagation medium are constituted by members each having substantially equal acoustic impedance.

* * * * *

UNITED STATES PATENT AND TRADEMARK OFFICE
CERTIFICATE OF CORRECTION

PATENT NO. : 4,819,215
DATED : April 4, 1989
INVENTOR(S) : YOKOYAMA et al

It is certified that error appears in the above—identified patent and that said Letters Patent is hereby corrected as shown below:

Col. 4, line 18, "between appliances" should read --between the appliances--.

Col. 6, line 30, "theses" should read --these--;

line 42, "exits" should read --exists--; and line 58, "Poisson'" should read --Poisson's--.

Col. 7, line 29, "charged" should read --changed--.

Col. 9, line 15, "deposited" should read --depicted--; and line 47, "aid" should read --acid--.

Col. 12, line 6, "transducers" should read --transducer--.

Signed and Sealed this

Third Day of July, 1990

Attest:

HARRY F. MANBECK, JR.

Attesting Officer

Commissioner of Patents and Trademarks